United States Patent [19]

Miller

[11] Patent Number: 5,397,662
[45] Date of Patent: Mar. 14, 1995

[54] PROCESS FOR FORMING A POLYMERIZED MATERIAL AND PRESENTING HOLOGRAPHIC IMAGES

[75] Inventor: Leroy J. Miller, Canoga Park, Calif.

[73] Assignee: Hughes Aircraft Company, Los Angeles, Calif.

[21] Appl. No.: 74,231

[22] Filed: Jun. 9, 1993

Related U.S. Application Data

[62] Division of Ser. No. 521,853, May 10, 1990, Pat. No. 5,250,391.

[51] Int. Cl.⁶ .................. G03H 1/04; G03H 1/18
[52] U.S. Cl. .......................................... 430/1; 430/2; 430/281; 359/1; 359/3
[58] Field of Search ............... 430/1, 2, 281; 522/25, 522/26, 50

[56] References Cited

U.S. PATENT DOCUMENTS

| | | | |
|---|---|---|---|
| 3,418,118 | 12/1968 | Thommes et al. | 522/26 |
| 3,531,281 | 9/1970 | Rust | 522/27 |
| 3,531,282 | 9/1970 | Miller et al. | 522/27 |
| 3,573,922 | 4/1971 | Rust | 430/286 |
| 3,627,656 | 12/1971 | Miller et al. | 430/281 |
| 3,694,218 | 9/1972 | Margerum et al. | 430/1 |
| 4,173,474 | 11/1979 | Tanaka et al. | 430/2 |
| 4,251,619 | 2/1981 | Kurita | 430/281 |
| 4,512,340 | 4/1985 | Buck | 522/33 |
| 4,698,113 | 10/1987 | Ogawa | 430/285 |
| 4,761,363 | 8/1988 | Hung et al. | 430/286 |
| 4,874,685 | 10/1989 | Adair | 522/26 |
| 4,950,567 | 8/1990 | Key et al. | 430/2 |
| 4,965,152 | 10/1990 | Keys et al. | 430/2 |
| 5,212,046 | 5/1993 | Lamola et al. | 522/26 |

OTHER PUBLICATIONS

The Condensed Chemical Dictionary, Tenth Edition, p. 677.
The Merck Index, An Encyclopedia of Chemicals, Drugs, and Biologicals, Tenth Edition, 1983, pp. 2104, 2117, and 9354.
The Merck Index © 1983 10th ed. pp. 1045–1046.

Primary Examiner—Janet C. Baxter
Assistant Examiner—Martin J. Angebranndt
Attorney, Agent, or Firm—V. D. Duraiswamy; W. K. Denson-Low

[57] ABSTRACT

A photopolymerizable composition includes a water-insoluble olefinic compound that is polymerizable with free-radical initiators, an oil-soluble phenothiazine dye that is soluble in water-immiscible organic solvents, and a reducing agent operable to react with the dye to form reactive free radicals only when the dye is in an excited state induced by exposure to light. The reducing agent and the dye are reacted together under the influence of light, and particularly red light. The resulting reactive free radicals cause the olefinic compound to polymerize to a polymer that is substantially unaffected by the presence of moisture.

4 Claims, No Drawings

PROCESS FOR FORMING A POLYMERIZED MATERIAL AND PRESENTING HOLOGRAPHIC IMAGES

This is a division of application Ser. No. 07/521,853 filed May 10, 1990, U.S. Pat. No. 5,250,391.

BACKGROUND OF THE INVENTION

This invention relates to photopolymers, and, more particularly, to a photopolymer composition and its polymerization procedure.

Photopolymers are polymers that are formed from constituents such as monomers as a result of the energy introduced by shining light into the constituents. A number of monomers have been used in photopolymerizing systems, with the acrylates and methacrylates the most popular. The mixture of constituents also includes an initiator, which is a reactant or combination of reactants that, when exposed to light, is activated and causes the polymerization of the other constituents.

Photopolymers are widely used to selectively record patterns and images. Some applications include the patterning of semiconductor substrates in the microelectronics industry and the preparation of holographic images. For example, in the preparation of a hologram, a sheet of the photopolymerizing mixture is exposed to properly configured laser light, causing selectively variable polymerization of the mixture. After the polymerized sheet is developed, the three-dimensional image is projected using laser light. In most circumstances, it is preferred to use the same wavelength of light for projection as was used for exposure.

Existing photopolymerizing systems have two major shortcomings when considered for use in many commercial applications. First, the final polymer is sensitive to moisture. The polymer tends to absorb water, either when immersed or from the water vapor in the air. In the case of a hologram, the absorption of water can distort the image that is recorded in the polymerizod material. It is therefore necessary to seal the polymer material containing the hologram hermetically shortly after the hologram is developed and the developer removed. Sometimes, however, hermetically sealing the hologram is not practical, either because of the nature of the piece of the polymer material containing the hologram, or because there is too great a likelihood that the hermetic seal will be broken during the intended life of the hologram. The cost of providing the required hermetic seal may be prohibitive. Finally, even with careful attention to developing and sealing the hologram, residual water from the developing procedure may eventually distort the image.

The second shortcoming with existing photopolymer systems is that, in many cases, they are sensitive to light of wavelengths that are not practical for use in some applications. Various available photopolymerizing systems are sensitive to a range of wavelengths, but in most cases are not sensitive to red light, such as produced by a helium-neon laser operating at 6328 Angstroms. In some potential applications the use of red light to project the hologram would be desirable, particularly where the color red has a traditional association in the minds of most persons. Red light also has the advantage that it has a lesser effect on reduction of night vision than do other wavelengths of visible light. For example, if a holographic image were to be used in either a warning system, a night-vision system, or an instrument panel that might be used at night, red projecting light would be preferred. The photopolymer system used to record the image would therefore desirably be sensitive to red light, so that red light could be used both for exposure of the holographic image and for its projection.

There is a need for a photopolymerizing system suitable for imaging applications, which is both inherently insensitive to water degradation and also is sensitive to polymerization under the action of red light, but no such system is now available. The present invention fulfills this need, and further provides related advantages.

SUMMARY OF THE INVENTION

The present invention provides a photopolymerizing system that produces a polymer which is substantially insensitive to reaction, swelling, and distortion when exposed to liquid water or water vapor. The photopolymer system can be processed and used in a manner similar to other photopolymer systems. The photopolymerizable constituents are polymerizable by exposure to visible light, and in particular to red light.

In accordance with the invention, a photopolymerizable comprises a composition comprises a water-insoluble olefinic compound that is polymerizable with free-radical initiators; an oil soluble phenothiazine dye that is soluble in water-immiscible organic solvents; and an oil soluble reducing agent operable to react with the dye to form reactive free radicals only when the dye is in an excited state induced by exposure to light. The dye and the reducing agent react to form reactive free radicals upon exposure to light, and in particular to red light such as produced by a helium-neon laser. The free radicals chemically initiate the polymerization reaction between the polymerizable compounds.

A key feature of the invention is that the polymerizable olefinic compound has a low affinity for water, which is manifested in its insolubility in water. Another manifestation is its insensitivity to exposure to water after polymerization. Because of the exclusion of water from the polymerizable system, the dye and the reducing agent must be soluble in the liquid olefinic compound prior to polymerization. The polymerization reaction is accomplished in a substantially anhydrous environment, thereby avoiding the possibility of retaining water in the polymer that could later adversely affect its properties.

The approach of the invention provides an important advance in the art of photopolymerizable systems. Photo polymerization is accomplished by visible light, and in particular red light. The resulting polymer is insensitive to alteration and degradation by exposure to water. A hologram formed in the polymer is therefore stable and free of distortion during long term use, even in humid environments, without hermetic sealing.

Other features and advantages of the invention will be apparent from the following more detailed description of the preferred embodiment, which illustrates, by way of example, the principles of the invention.

DETAILED DESCRIPTION OF THE INVENTION

The photopolymerizable composition of the invention is a mixture of three components, the water-insoluble olefinic compound that is polymerizable with free-radical initiators, the oil soluble phenothiazine dye that is soluble in water-immiscible organic solvents, and the oil soluble reducing agent that is soluble in water-immiscible organic solvents and is operable to react with the dye to form reactive free radicals only when the dye is in an excited state induced by exposure to light. The term "oil soluble" as used herein is a term of art meaning that a solute is soluble in oily solvents that are themselves substantially insoluble in water, and specifically are soluble in the water-insoluble olefinic compounds that form the major component of the photopolymerizable composition.

When exposed to light, the dye functions as a photooxidant. That is, the dye is an oxidizing agent whose oxidizing power is increased by the absorption of visible light to convert it to an excited state. The excited dye reacts with the reducing agent to form free radicals, which in turn initiate the polymerization reaction. With the preferred embodiment of the present approach, these reactions occur in an anhydrous system and with excitation by red light.

The water-insoluble olefinic compound can be, for example, a monomer, a mixture of monomers, a mixture of monomers and photocrosslinkable polymers, or a mixture of monomers and photocrosslinkable oligomers.

The water-insoluble olefinic compound is preferably an acrylate, a methacrylate, or a styrene. Examples of operable acrylates include methyl acrylate, ethyl acrylate, propyl acrylate, n-butyl acrylate, sec-butyl acrylate, iso-butyl acrylate, tert-butyl acrylate, pentyl acrylate, hexyl acrylate, 2-ethylhexyl acrylate, octyl acrylate, benzyl acrylate, furfuryl acrylate, cyclohexyl acrylate, and mixtures thereof. Examples of operable metacrylates include methyl methacrylate, ethyl methacrylate, propyl methacrylate, n-butyl methacrylate, sec-butyl methacrylate, iso-butyl methacrylate, tert-butyl methacrylate, pentyl methacrylate, hexyl methacrylate, 2-ethylhexyl methacrylate, octyl methacrylate, benzyl methacrylate, furfuryl methacrylate, cyclohexyl methacrylate, and mixtures thereof. Examples of operable styrenes include styrene, p-methylstyrene, p-methoxystyrene, p-chlorostyrene, p-bromostyrene, p-fluorostyrene, 3,4-dichlorostyrene, p-tert-butyl-styrene, p-isopropylstyrene, m-chlorostyrene, 2,6-dichlorostyrene, o-chlorostyrene, dimethylstyrene, and mixtures thereof.

Polyfunctional monomers may be used as one of the olefinic compounds in the polymerizable mixture, and may be the only olefinic compounds due to their ease of crosslinking. Examples of operable polyfunctional monomers include ethylene diacrylate, diethylene glycol diacrylate, triethylene glycol diacrylate, 1,2-propanediol diacrylate, 1,3-propanediol diacrylate, dipropylene glycol diacrylate, 2,2-dimethylpropanediol diacrylate, 1,3-butanediol diacrylate, 1,4-butanediol diacrylate, 1,5-pentanediol diacrylate, 1,6-hexanediol diacrylate, phenylene diacrylate, bisphenol A diacrylate, trimethylolethane triacrylate, trimethylolpropane triacrylate, pentaerythritol tetraacrylate, dipentaerythritol monohydroxypentaacrylate, 3-methylpentanendiol diacrylate, pentaerythritol triacrylate, thiodiethylene glycol diacrylate, tripropylene glycol diacrylate, 1,8-octanediol diacrylate, 1,9-nonanediol diacrylate, 1,10-decanediol diacrylate, 1,12-dodecanediol diacrylate, and mixtures thereof, as well as the corresponding methacrylate esters.

The olefinic compound may also be a mixture of compounds with reactive double bonds to which are added compounds with reactive thiol groups, wherein the compounds with reactive double bonds have an average of at least two double bonds per molecule and the compounds with reactive thiol groups have an average of at least two thiol groups per molecule. Operable classes of reactive olefins with an average of at least two double bonds include polyfunctional acrylates, polyfunctional methacrylates, polyfunctional allyl compounds, and mixtures of polyfunctional acryates and polyfunctional allyl compounds. Examples of operable compounds with an average of at least two double bonds per molecule include diallyl phthalate, diallyl isophthalate, diallyl terephthalate, diallyl maleate, diallyl fumarate, diallyl itaconate, diallyl carbonate, diallyl malonate, diallyl succinate, diallyl adipate, diallyl suberate, diallyl diglycol carbonate, diallyl isocyanurate, triallyl isocyanurate, triallyl cyanurate, triallyl trimellitate, triallyl trimesate, trimethylolpropane triallyl ether, trimethylolpropane diallyl ether, trimethylolpropane diallyl ether monomethacrylate, pentaerythritol triallyl ether, tetraallyl pyromellitate, tetraallyloxyethane, allyl acrylate, and allyl methacrylate. Examples of operable compounds containing reactive thiol groups include glycol dimercaptopropionate, glycol dimercaptoacetate, 2,2'-dimercapto diethyl ether, trimethylolethane trithioglycolate, trimethylolethane tri(3-mercaptopropionate), trimethylolpropane trithioglycolate, trimethylolpropane tri(3-mercaptopropionate), pentaerythritol tetrathioglycolate, pentaerythritol tetra(3-mercaptopropionate), dipentaerythritol hexa(3-mercaptopropionate), and pentaerythritol tetrakis(3-mercaptopropyl ether).

Compounds such as those acrylates, methacrylates, or styrenes that have an affinity for water, as may be evidenced by a solubility in water, are not operable. Some illustrative examples of inoperable compounds include hydroxyethyl acrylate, hydroxypropyl acrylate, 2-(2-ethoxyethoxy)ethyl acrylate, hydroxyethyl methacrylate, hydroxypropyl methacrylate, and 2-(2-ethoxyethoxy)ethyl methacrylate. Very minor amounts of such compounds having an affinity for water are tolerable in the mixture, as long as the amount is so small that the substantial insensitivity of the final polymer to water is not lost.

The second component of the mixture is a water-insoluble phenothiazine-based dye that is soluble in water-immiscible organic solvents, and specifically in the liquid olefinic compound prior to polymerization. Phenothiazine-based dyes are well known. Phenothiazine, which itself is not a dye, is described in Entry 7052 of the Merck Index (Ninth Edition). Methylene blue, one of the best known of the phenothiazine-based dyes and described as entry 5929 of the Merck Index (Ninth Edition), is formed by substituting dimethylamino groups at the 3 and 7 positions of the phenothiazine molecule, and associating an anion, such as a chloride or organic soluble anion, with the resulting cation. Other well known phenothiazine dyes include azure A, B, and C, thionine, and methylene green.

Many phenothiazine dyes are soluble in water and not in water-immiscible organic solvents, and care must be taken to ensure that only the proper phenothiazine-based dye is used. Either a known phenothiazine-based dye having these characteristics can be used, or a water-miscible phenothiazine-based dye can be processed into an operable compound. Such processing can be accomplished by treating the water-miscible phenothiazine dye in a strong base such as 10–15 percent aqueous sodium hydroxide, extracting the aqueous solution with an organic solvent such as chloroform, acidifying the organic solution with an organic acid such as acrylic acid, benzenesulfonic acid, p-toluenesulfinic acid, acrylic acid, methacrylic acid, alpha-chloroacrylic acid, or alpha-bromoacrylic acid, and evaporating the solvent to dryness.

The third component of the polymerizable mixture is the reducing agent. Preferred reducing agents are the hydroxymethylsulfone, formed as adducts of sulfinic acids and aldehydes, such as, for example, hydroxymethyl phenyl sulfone and hydroxymethyl p-tolyl sulfone, and mercaptans (also known as thiols). The mercaptans can be part of the monomer mixture, and thereby perform the dual role of polymerizable monomer and reducing agent.

In practicing the invention, the olefinic compound, the dye, and the reducing agent are mixed together as a viscous liquid. The amounts of the dye and the reducing agent are typically much smaller than the amount of the polymerizable monomer. The concentration of dye is typically about $10^{-6}$–$10^{-3}$ molar, and the concentration of reducing agent is typically about $10^{-3}$–$10^{-1}$ molar. Of course, if a dual-functioning mercaptan is used as the reducing agent, the concentration of the reducing agent may be much higher.

The mixture is then exposed to light, which initiates the dye-reducing agent reaction to produce reactive free radicals that in turn produce photopolymerization of the olefinic compound. The light can be exposed either generally, selectively through a mask, selectively by moving a beam of light, or otherwise as might be required. Selective exposure produces selective localized polymerization and hardening where the light was directed.

Exposure may be by a laser, such as a helium-neon laser that produces monochromatic coherent red light at 6328 Angstroms. If the exposure is in the manner of a hologram using coherent monochromatic light, the information contained in the light beams is stored in the pattern of polymerized regions of the polymer sheet.

The hologram is developed in the conventional manner. The exposed hologram is placed into a solvent such as acetone for a period of about 15 seconds to 5 minutes. The unpolymerized monomer dissolves to produce voids and the polymerized monomer swells slightly. The greater the exposure, the more polymerization and crosslinking, and the less material is dissolved in the solvent. Highly exposed portions of the hologram exhibit low swelling and a high refractive index. The hologram is next placed into a nonsolvent such as methanol to remove the solvent and harden the polymer, producing the final hologram.

A beam of coherent light later shone through the developed polymer sheet reads the information stored in the polymer sheet as a three-dimensional reproduction of the original objects. The beam of coherent light used to project the image is preferably of the same wavelength as the beam used to expose the image and photopolymerize the mixture.

In accordance with this aspect of the invention, a process for presenting holographic images comprises the steps of furnishing a piece of a photopolymerizable composition comprising a water insoluble, photopolymerizable olefinic compound that is polymerizable with free radical initiators, an oil soluble phenothiazine dye that is soluble in water-immiscible organic solvents, and an oil soluble reducing agent operable to react with the dye to form reactive free radicals only when the dye is in an excited state induced by exposure to light; directing two coherent beams of visible light toward the piece of the photopolymerizable composition to polymerize the composition and expose an image into the piece; developing the image; and projecting the image by directing coherent visible light through the piece of the polymerized composition.

The following examples are presented as illustrative of aspects of the invention, and should not be taken as limiting the invention in any respect.

EXAMPLE 1

A 0.5 gram sample of commercial methylene blue was dissolved in 40 milliliters of water and combined with an equal volume of chloroform in a separatory funnel. After shaking the funnel, the chloroform turned only very slightly blue, indicating only slight solubility of the methylene blue in the chloroform. Another 40 milliliters of water and 12 grams of sodium hydroxide were added, and the mixture was shaken. Both the aqueous and organic phases were very dark in color, indicating that the methylene blue was now soluble in the organic chloroform phase. A portion of the dark red chloroform phase was drawn off and evaporated to dryness. A portion of the purple residue was dissolved in the olefinic monomer triethylene glycol diacrylate (TEGDA), in which it formed a deep blue solution. The solution was filtered to remove any insoluble particles. The solution of the olefinic compound and dye was found to have about 0.78 milligrams per milliliter of the dye.

solution was prepared by mixing 0.10 grams of hydroxymethyl p-tolyl sulfone reducing agent, 0.10 grams of the inert solvent triethylene glycol, and 1.00 grams of the solution of the olefinic compound and dye. A portion of the solution was exposed under a 15 watt lamp emitting white light, at a distance of 3 inches. Some polymer formed in 1 minute, and after 10 minutes the material was about half polymerized.

EXAMPLE 2

Ten microliters of the solution of the olefinic compound and dye, prepared according to the procedure described in the first paragraph of Example 1, was mixed with 65 microliters of pentaerythritol tetraacrylate and 100 microliters of pentaerythritol tetra-3-mercaptopropionate. It is estimated that the ratio of thiol groups to double bonds in the mixture was about 1.00. A drop of this mixture was placed between two thin glass slides and exposed to light from a tungsten filament microscope lamp at a distance of about three inches. After 1 minute of exposure, the two glass slides stuck together, indicating that the composition had polymerized.

EXAMPLE 3

Example 2 was repeated, except that amounts of the components of the mixture were 10 microliters of the solution of olefinic compound and dye, 100 microliters of pentaerythritol tetraacrylate and 100 microliters of pentaerythritol tetra-3-mercaptopropionate (which acts as the reducing agent). It is estimated that the ratio of thiol groups to double bonds in the mixture was about 0.67. Polymerization occurred after 10 seconds of illumination.

EXAMPLE 4

Example 2 was repeated, except that the components of the mixture were 10 microliters of the solution of olefinic compound and dye, 175 microliters of pentaerythritol tetraacrylate and 25 microliters of pentaerythritol tetra-3-mercaptopropionate (which acts as the reducing agent). It is estimated that the ratio of thiol groups to double bonds in the mixture was about 0.099. Polymerization occurred after 10 seconds of illumination.

EXAMPLE 5

Example 2 was repeated, except that the components of the mixture were 10 microliters of the solution of olefinic compound and dye, 190 microliters of pentaerythritol tetraacrylate and 10 microliters of pentaerythritol tetra-3-mercaptopropionate (which acts as the reducing agent). It is estimated that the ratio of thiol groups to double bonds in the mixture was about 0.037. Polymerization occurred after 50 seconds of illumination.

Examples 3-6 demonstrate that the polymerization time of the mixture can be varied over a range by changing the ratios of the components.

EXAMPLE 6

Five grams of commercial methylene blue was dissolved in 80 milliliters of water. Twelve grams of sodium hydroxide and 80 milliliters of chloroform were added. The mixture was shaken in a separatory funnel. Sixty milliliters of the chloroform layer was drawn off and washed three times with water (about 70 milliliters in each washing). The water washings were blue, and the chloroform solution was reddish purple. About half of the chloroform solution was acidified with 1-2 drops of acrylic acid, and it turned dark blue. The solvent was stripped off, and the residue dried under vacuum in a desiccator for about 1 hour. The residue weighed 154 milligrams. A 20.75 milligram portion of this solid residue was stirred in 15 milliliters of triethylene glycol diacrylate for 22 hours, and the solution was filtered. One hundred microliters of acrylic acid was added to the solution, which turned blue.

A solution was formed from 10 microliters of the solution containing the olefinic compound and dye, whose preparation was described in the preceding paragraph, 100 microliters of pentaerythritol tetraacrylate, and 100 microliters of pentaerythritol tetra-3 -mercaptopropionate. A portion of this solution was placed between a glass plate and a piece of clear, straw-colored plastic separated by a 0.005 inch thick spacer. The solution was exposed through the plastic cover with a dose of 99 millijoules per square centimeter of red light of 6328 Angstroms produced by a helium-neon laser. The plastic cover was stripped off, and a hard polymer film remained.

The present invention provides a composition and preparation procedure for photopolymers responsive to visible light, and which do not absorb any substantial amount of water during use. Although particular embodiments of the invention have been described in detail for purposes of illustration, various modifications may be made without departing from the spirit and scope of the invention. Accordingly, the invention is not to be limited except as by the appended claims.

What is claimed is:

1. A process for producing and replaying holographic images, comprising the steps of:
   furnishing a sheet of a photopolymerizable composition comprising
      a water insoluble, photopolymerizable olefinic compound that is polymerizable with free radical initiators,
      an oil soluble phenothiazine dye that is soluble in water-immiscible organic solvents, and
      an oil soluble reducing agent operable to react with the dye to form reactive free radicals only when the dye is in an excited state induced by exposure to light;
   directing two coherent beams of visible light toward the sheet of the photopolymerizable composition to polymerize the composition to expose a holographic image into the sheet;
   developing the holographic image; and
   projecting the image by directing coherent visible light through the sheet of the polymerized composition.

2. The process of claim 1 wherein the step of developing the image comprises placing the composition first in a solvent for the unpolymerized monomer and then in a nonsolvent for the unpolymerized monomer.

3. A process for producing holographic images, comprising the steps of:
   furnishing a sheet of a photopolymerizable composition comprising
      a water insoluble, photopolymerizable olefinic compound that is polymerizable with free radical initiators,
      an oil soluble phenothiazine dye that is soluble in water-immiscible organic solvents, and
      an oil soluble reducing agent operable to react with the dye to form reactive free radicals only when the dye is in an excited state induced by exposure to light;
   directing two coherent beams of visible light toward the sheet of the photopolymerizable composition to polymerize the composition to expose a holographic image into the sheet and
   developing the holographic image.

4. A holographic product made by the process of claim 3.

* * * * *